United States Patent
Jang et al.

(10) Patent No.: US 9,628,070 B2
(45) Date of Patent: Apr. 18, 2017

(54) RADIO FREQUENCY SWITCH CIRCUIT AND CONTROL METHOD THEREOF

(71) Applicant: Samsung Electro-Mechanics Co., Ltd., Suwon-si (KR)

(72) Inventors: Dae Seok Jang, Suwon-si (KR); Yoo Hwan Kim, Suwon-si (KR); Hyun Hwan Yoo, Suwon-si (KR); Yoo Sam Na, Suwon-si (KR); Jong Myeong Kim, Suwon-si (KR); Hyun Jin Yoo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/956,502

(22) Filed: Dec. 2, 2015

(65) Prior Publication Data

US 2016/0156345 A1    Jun. 2, 2016

(30) Foreign Application Priority Data

Dec. 2, 2014 (KR) .................. 10-2014-0170524

(51) Int. Cl.
*H03K 17/687* (2006.01)
*H03K 17/16* (2006.01)
*H03K 17/693* (2006.01)

(52) U.S. Cl.
CPC ......... *H03K 17/161* (2013.01); *H03K 17/687* (2013.01); *H03K 17/693* (2013.01)

(58) Field of Classification Search
CPC .................. H03K 17/567; H03K 17/687
See application file for complete search history.

(56) References Cited

U.S. PATENT DOCUMENTS

| | | | | |
|---|---|---|---|---|
| 5,777,530 | A * | 7/1998 | Nakatuka | H01P 1/15 333/104 |
| 6,094,088 | A * | 7/2000 | Yano | H03K 17/693 327/534 |
| 8,320,843 | B2 * | 11/2012 | Seshita | H03K 17/693 333/103 |
| 2009/0181630 | A1 | 7/2009 | Seshita et al. | |

FOREIGN PATENT DOCUMENTS

| | | |
|---|---|---|
| JP | 2009-124653 A | 6/2009 |
| JP | 2009-194891 A | 8/2009 |

\* cited by examiner

*Primary Examiner* — Hai L Nguyen
(74) *Attorney, Agent, or Firm* — NSIP Law

(57) ABSTRACT

A radio frequency switch circuit may include a first switch circuit unit connected between a signal port and an antenna port, a second switch circuit unit connected between the signal port and a ground, and a third switch circuit unit connected between the antenna port and the ground. An operation reference voltage of the third switch circuit unit is lower than an operation reference voltage of the first switch circuit unit.

18 Claims, 13 Drawing Sheets

RADIO FREQUENCY SWITCH CIRCUIT AND CONTROL METHOD THEREOF

CROSS-REFERENCE TO RELATED APPLICATION

This application claims the benefit under 35 USC 119(a) Korean Patent Application No. 10-2014-0170524 filed on Dec. 2, 2014, with the Korean Intellectual Property Office, the disclosure of which is incorporated herein by reference.

BACKGROUND

1. Field

The present disclosure relates to a radio frequency switch circuit and a control method thereof.

2. Description of Related Art

In accordance with the development of wireless communications technology, various communications standards have been integrated in a functionality of a single mobile device or terminal. For example, the latest mobile communications terminals support communications standards such as GSM (Global System/Standard for Mobile Communications), CDMA (Code Division Multiple Access), UMTS (Universal Mobile Telecommunications System), LTE (Long Term Evolution), and other similar standards, and are gradually supporting a greater number of bands to sustain and process a large amount of data traffic to a user.

In order to support a greater number of bands, a radio frequency (RF) switch may be used. The radio frequency switch changes paths of input and output signals to frequency bands to be used among several bands to be implemented.

In order to satisfy a communications standard, there is a need to decrease interference between a plurality of radio frequency switches. For example, in a case in which the plurality of radio frequency switches are adjacent to each other, a signal passing through a radio frequency switch to be transmitted may be input into an unintended radio frequency switch, which is adjacent to the radio frequency switch, thereby causing interference. Therefore, a radio frequency switch capable of decreasing interference is needed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a radio frequency switch circuit, including: a first switch circuit unit connected between a signal port and an antenna port; a second switch circuit unit connected between the signal port and a ground; and a third switch circuit unit connected between the antenna port and the ground, wherein an operation reference voltage of the third switch circuit unit is lower than an operation reference voltage of the first switch circuit unit.

The radio frequency switch circuit may also include a control unit configured to generate a first gate signal, a second gate signal, and a third gate signal to control the first switch circuit unit, the second switch circuit unit, and the third switch circuit unit, respectively.

The first switch circuit unit, the second switch circuit unit, and the third switch circuit unit each may include transistors, and one terminal of each of the transistors may receive a gate signal.

The transistors may enter an on-state when a voltage of the gate signal is higher than the operation reference voltage associated with the first switch circuit unit, the second switch circuit unit, and the third switch circuit unit.

The first switch circuit unit may enter an on-state in a transmission and reception mode and may enter an off-state in an isolation mode, and the second switch circuit unit may enter the off-state in the transmission and reception mode and may enter the on-state in the isolation mode.

The third switch circuit unit may include a depletion-type field effect transistor, and the operation reference voltage may be a negative voltage.

The depletion-type field effect transistor may have a gate terminal connected to a pull down resistor connected to the ground.

The control unit may exclude generation of the first gate signal, the second gate signal, and the third gate signal in a low power mode.

The first switch circuit unit may enter an off-state in response to the first gate signal not being generated, the second switch circuit unit may enter the off-state in response to the second gate signal not being generated, and the third switch circuit unit may enter an on-state in response to the third gate signal not being generated.

The first switch circuit unit may include a field effect transistor of an enhancement type with an operation reference voltage being a threshold voltage, and the third switch circuit unit may include a depletion type field effect transistor with an operation reference voltage being a negative voltage, wherein the operation reference voltage of the third switch circuit unit is lower than the operation reference voltage of the first switch circuit unit.

In accordance with an embodiment, there is provided a radio frequency switch circuit, including: a first switch circuit unit connected between a first signal port and an antenna port; a second switch circuit unit connected between the first signal port and a ground; a third switch circuit unit connected between the antenna port and the ground; a fourth switch circuit unit connected between a second signal port and the antenna port; and a fifth switch circuit unit connected between the second signal port and the ground, wherein an operation reference voltage of the third switch circuit unit is lower than an operation reference voltage of the first switch circuit unit and an operation reference voltage of the fourth switch circuit unit.

The radio frequency switch circuit may also include a control unit configured to generate a first gate signal, a second gate signal, a third gate signal, a fourth gate signal, and a fifth gate signal to control the first switch circuit unit, the second switch circuit unit, the third switch circuit unit, the fourth switch circuit unit, and the fifth switch circuit unit, respectively.

The first switch circuit unit may enter an on-state in response to the first signal port being in a transmission and reception mode and may enter an off-state in response to other signal ports being in the transmission and reception mode or an isolation mode The second switch circuit unit may enter the off-state in response to the first signal port being in the transmission and reception mode and may enter the on-state in response to other signal ports being in the transmission and reception mode or the isolation mode.

The third switch circuit unit may include a depletion-type field effect transistor, the operation reference voltage is a negative voltage, and the depletion-type field effect transistor may include a gate terminal connected to a pull down resistor connected to the ground.

The third switch circuit unit may enter an on-state in a low power mode, and the control unit excludes generation of the first, the second, the third, the fourth, and the fifth gate signals in the low power mode.

The control unit may interrupt conduction between signal ports and an antenna port in response to the radio frequency switch circuit being operated in a first mode, may conduct between the antenna port and a ground in response to the radio frequency switch circuit being operated in the first mode, may conduct between one of the signal ports and the antenna port and may interrupt conduction between other signal ports and the antenna port in response to the radio frequency switch circuit being operated in a second mode, may interrupt conduction between one of the signal ports and the ground and may conduct between other signal ports and the ground in response to the radio frequency switch circuit being operated in the second mode, and may interrupt conduction between the antenna port and the ground in response to the radio frequency switch circuit being operated in the second mode.

The control unit may interrupt conduction between the signal ports and the ground in response to the radio frequency switch circuit is operated in the first mode, may interrupt conduction between the signal ports and the antenna port in response to the radio frequency switch circuit being operated in a third mode, may conduct between the signal ports and the ground in response to the radio frequency switch circuit being operated in the third mode, and may interrupt the signal transmission and reception between the antenna port and the ground in response to the radio frequency switch circuit being operated in the third mode.

Other features and aspects will be apparent from the following detailed description, the drawings, and the claims.

BRIEF DESCRIPTION OF DRAWINGS

The above and other aspects, features and advantages of the present disclosure will be more clearly understood from the following detailed description taken in conjunction with the accompanying drawings, in which.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
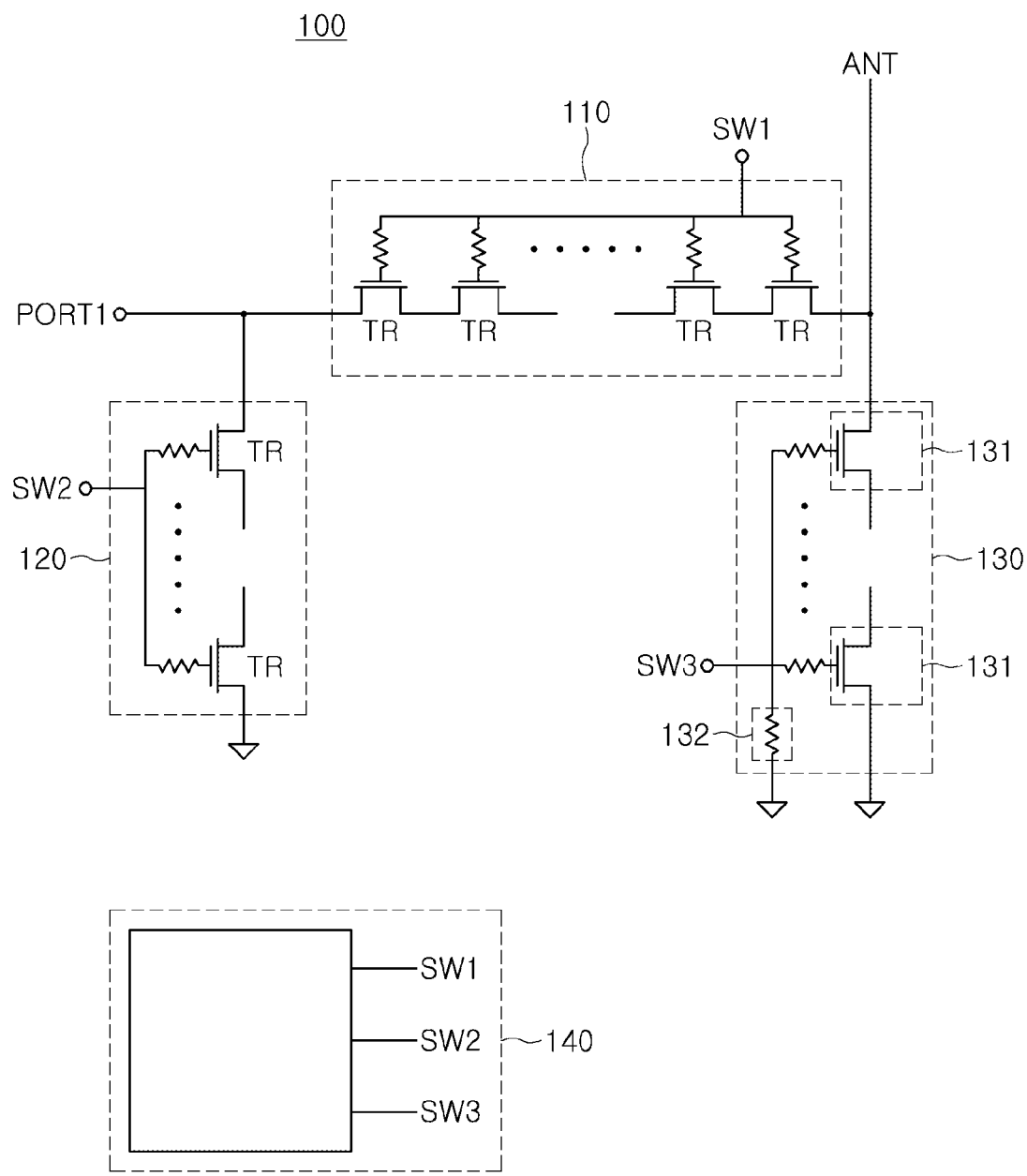
FIGS. 1 and 2 are views illustrating a radio frequency switch circuit, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be understood that when an element or layer is referred to as being "on" or "connected to" another element or layer, it can be directly on or connected to the other element or layer or through intervening elements or layers may be present. In contrast, when an element is referred to as being "directly on" or "directly connected to" another element or layer, there are no intervening elements or layers present. Like reference numerals refer to like elements throughout. As used herein, the term "and/or" includes any and all combinations of one or more of the associated listed items.

Figure 2:
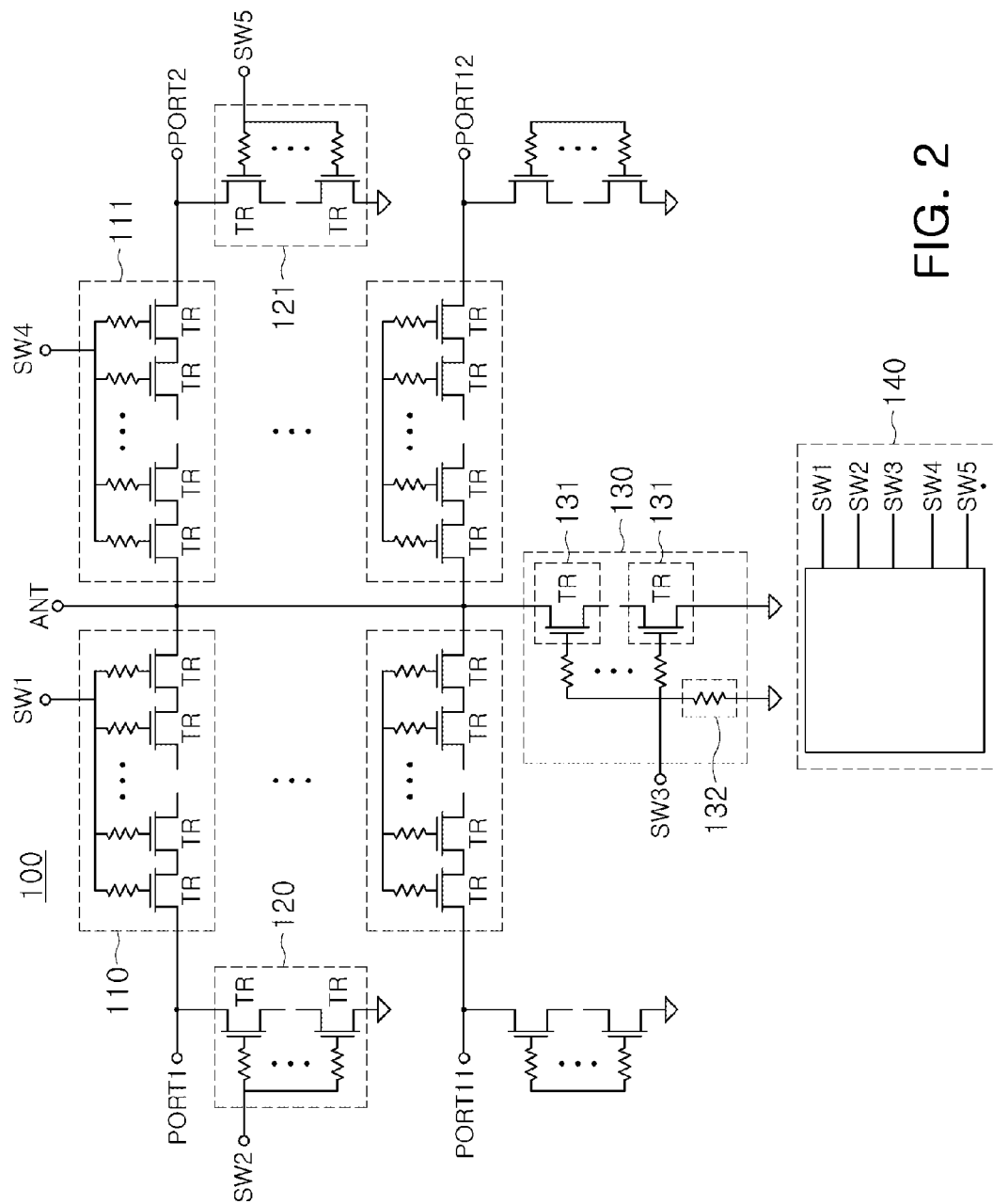

FIGS. 1 and 2 are views illustrating a radio frequency switch circuit according to an embodiment.

Referring to FIG. 1, a radio frequency switch circuit 100, according to an embodiment, includes a first switch circuit unit 110, a second switch circuit unit 120, a third switch circuit unit 130, and a control unit 140.

The first switch circuit unit 110 is connected between a signal port PORT1 for a signal transmission and reception and a common connection node connected to an antenna port ANT, and is operated using a first gate signal SW1.

The first switch circuit unit 110 enters an on-state in a transmission and reception mode and enters an off-state in an isolation mode. In one example, the transmission and reception mode is a state in which a radio frequency signal is transmitted and received through the signal port PORT1 and the antenna port ANT. In addition, the isolation mode is a state in which the radio frequency signal is not transmitted and received through the signal port PORT1 and the antenna port ANT.

The second switch circuit unit 120 is connected between the signal port PORT1 and a ground GND and is operated using a second gate signal SW2.

The second switch circuit unit 120 enters an off-state in the transmission and reception mode and enters an on-state in the isolation mode. For example, the second switch circuit unit 120 enters the off-state in the transmission and reception mode to prevent the transmitted and received radio frequency signals flowing into the ground from being lost. For example, the second switch circuit unit 120 enters the on-state in the isolation mode so that isolation between the respective ports is enhanced.

The third switch circuit unit 130 is connected between the common connection node connected to the antenna port ANT and the ground and is operated using a third gate signal switch SW3.

In addition, the third switch circuit unit 130 has an operation reference voltage lower than that of the first switch circuit unit 110. In one example, the operation reference voltage is a voltage that is based on conduction and interruption of a switch.

For example, the first switch circuit unit 110 includes a field effect transistor of an enhancement type, and the third switch circuit unit 130 includes a field effect transistor 131, a depletion type field effect transistor. In an embodiment, an operation reference voltage of the field effect transistor of the enhancement type is a threshold voltage. In addition, an operation reference voltage of the depletion type field effect transistor is a negative voltage. Because the negative voltage is lower than the threshold voltage, the operation reference voltage of the third switch circuit unit 130 is lower than that of the first switch circuit unit 110.

The depletion-type field effect transistor 131 has a gate terminal connected to a pull down resistor 132 connected to the ground. The gate terminal of the depletion-type field effect transistor 131 is connected to the ground through the pull down register, and thus the depletion-type field effect transistor 131 is in an on-state even though the control unit 140 is not operated. Therefore, a signal input causing interference flows into the ground through the third switch circuit unit 130. As a result, interference of the radio frequency switch circuit 100 is suppressed.

Furthermore, the first switch circuit unit 110, the second switch circuit unit 120, and the third switch circuit unit 130 each include a plurality of transistors (TRs). For example, the respective switch circuit units include a plurality of field effect transistors (FETs) having source terminals and drain terminals, which are connected in series with each other. In an example, the number of plurality of transistors (TRs) varies depending on magnitude of a transmitted radio frequency signal and a breakdown voltage of the transistor (TR).

For example, one terminal of each of the plurality of transistors (TRs) receives a gate signal SW. When a voltage of the gate signal SW is larger than the operation reference voltage, the plurality of transistors (TRs) enter an on-state.

The control unit 140 generates the first gate signal SW1, the second gate signal SW2, and the third gate signal SW3 to control the first switch circuit unit 110, the second switch circuit unit 120, and the third switch circuit unit 130. In one example, the gate signal SW is a direct current (DC) voltage.

For example, the control unit 140 controls an on-off operation of the first switch circuit unit 110 for a signal transfer between the antenna port ANT and the signal port PORT1. The control unit 140 controls an on-off operation of the second switch circuit unit 120 in order to prevent leakage signals and noises from being input and output through the ports.

In addition, the control unit 140 does not generate the gate signal when in a low power mode. In one example, the low power mode is a state in which the radio frequency signal is not transmitted and received through the signal port PORT and the antenna port ANT and power consumption is reduced. For example, in the case of the low power mode, the control unit 140 does not operate to significantly the power consumption. Therefore, the control unit 140 is supplied with little power.

For example, the field effect transistor of the enhancement type, included in the first switch circuit unit 110 and the second switch circuit unit 120, enter an off-state in a case in which the gate signal is not applied to the field effect transistor of the enhancement type through a gate of the field effect transistor of the enhancement type. For instance, because a voltage Vgs between a gate terminal and a source terminal of the transistor is lower than the threshold voltage, the source terminal and a drain terminal of the transistor interrupt each other.

On the other hand, the depletion type field effect transistor included in the third switch circuit unit 130 enters an on-state in a case in which the gate signal is not applied to the depletion type field effect transistor, through a gate of the depletion type field effect transistor. For instance, because the voltage Vgs between a gate terminal and a source terminal of the transistor are higher than the operation reference voltage, which is the negative voltage, the source terminal and the drain terminal of the transistor conduct with each other. Therefore, even though the control unit 140 is not operated, the signal input externally to cause interference flows into the ground through the third switch circuit unit 130.

Referring to FIG. 2, the radio frequency switch circuit 100, according to an embodiment, further includes a fourth switch circuit unit 111 and a fifth switch circuit unit 121.

The radio frequency switch circuit 100 is connected to one or more signal ports to transmit and receive the radio frequency signal from the respective signal ports PORT. Therefore, five or more switch circuit units are included in the radio frequency switch circuit 100.

In addition, the radio frequency switch circuit 100 includes a single third switch circuit unit 130, regardless of the number of signal ports PORT. For example, the single third switch circuit unit 130 suppresses all interference of a plurality of switch circuit units.

The fourth switch circuit unit 111 is connected between a second signal port PORT2 for a signal transmission and reception and the common connection node connected to the antenna port ANT. The fourth switch circuit unit 111 is operated using a fourth gate signal SW4. In one example, the fourth switch circuit unit 111 performs the same function as that of the first switch circuit unit 110.

In addition, the fourth switch circuit unit 111 enters an on-state when the second signal port PORT2 is in a transmission and reception mode and enters an off-state when other signal ports are in the transmission and reception mode or an isolation mode.

The fifth switch circuit unit 121 is connected between the second signal port PORT2 and the ground and is operated using a fifth gate signal. In one example, the fifth switch circuit unit 121 performs the same function as that of the second switch circuit unit 120.

The fifth switch circuit unit 121 enters an off-state when the second signal port PORT2 is in a transmission and reception mode and enters an on-state when other signal ports are in the transmission and reception mode or an isolation mode.

FIGS. 3 through 9 are views illustrating an operation of the radio frequency switch circuit, according to an embodiment.

Figure 3:
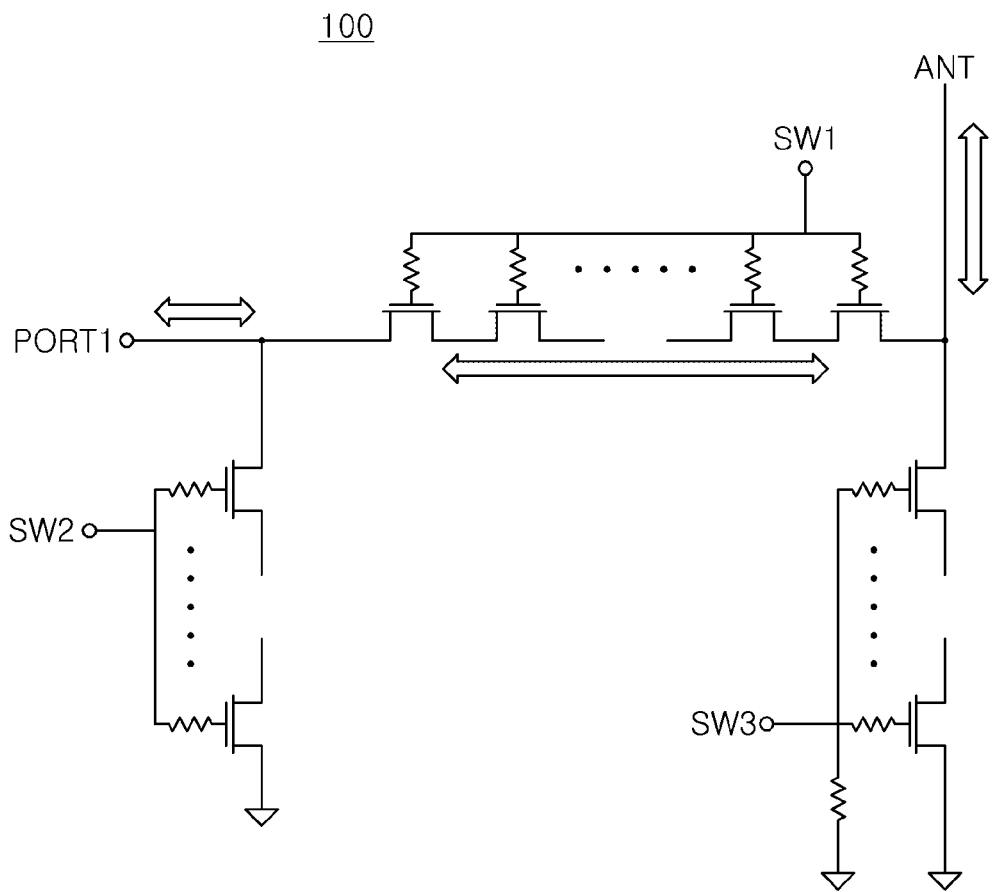
FIG. 3 illustrates an operation at one port of the radio frequency switch circuit in a transmission and reception mode.
Figure 3:
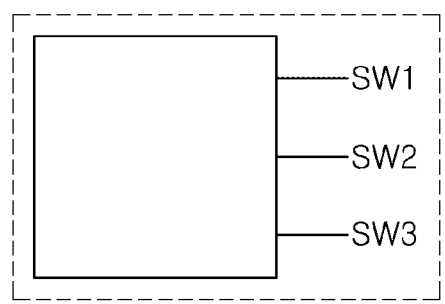

FIG. 3 illustrates an operation at one port of the radio frequency switch circuit 100 in the transmission and reception mode.

Referring to FIG. 3, the first switch circuit unit 110 is in an on-state, and the second switch circuit unit 120 and the third switch circuit unit 130 is in an off-state. The radio frequency signal input through the signal port PORT passes through the first switch circuit unit 110 and radiates or is transmitted to the antenna port ANT.

Figure 4:
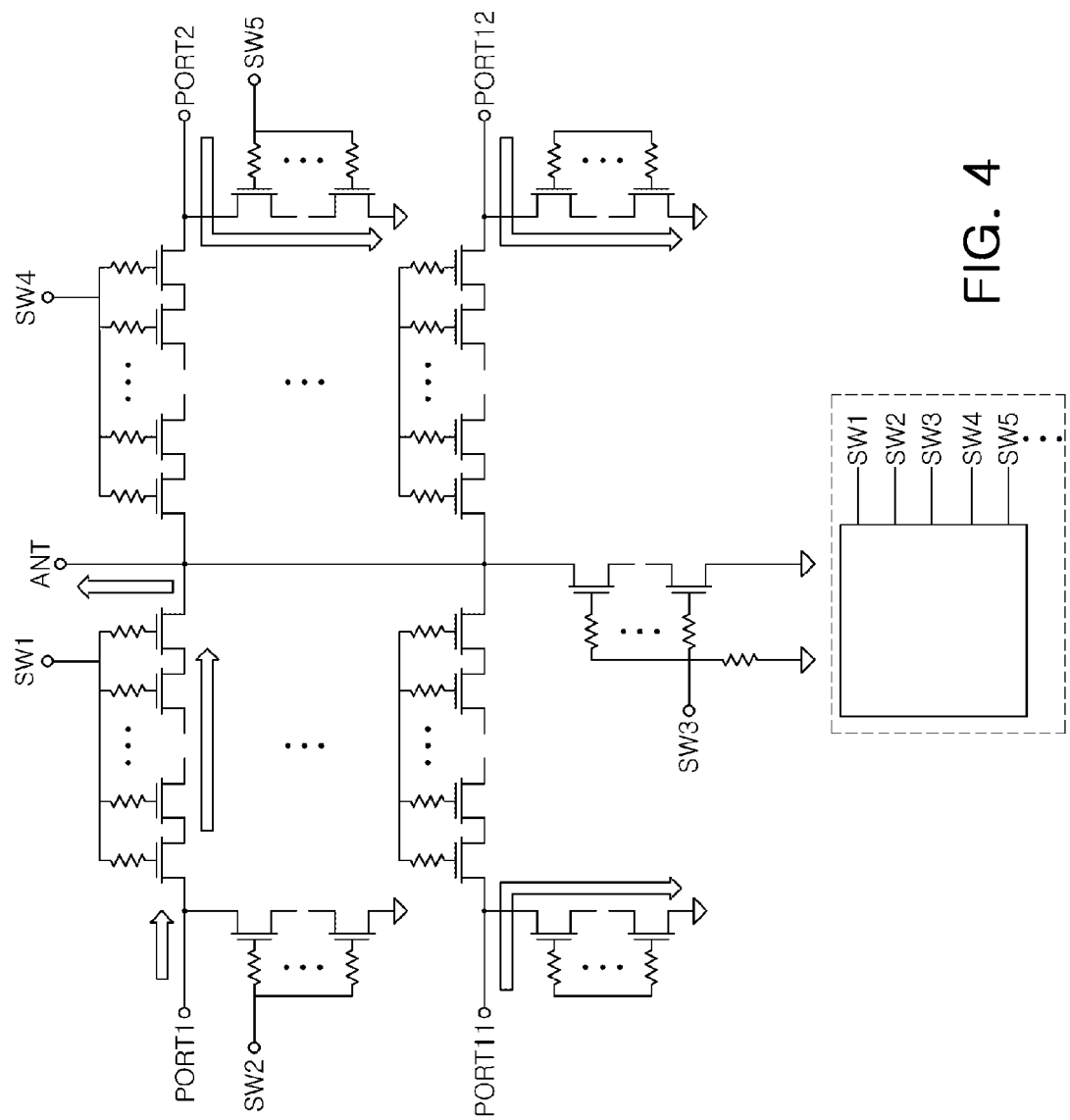
FIGS. 4 and 5 illustrate an operation of the radio frequency switch circuit in the transmission and reception mode.
Figure 5:
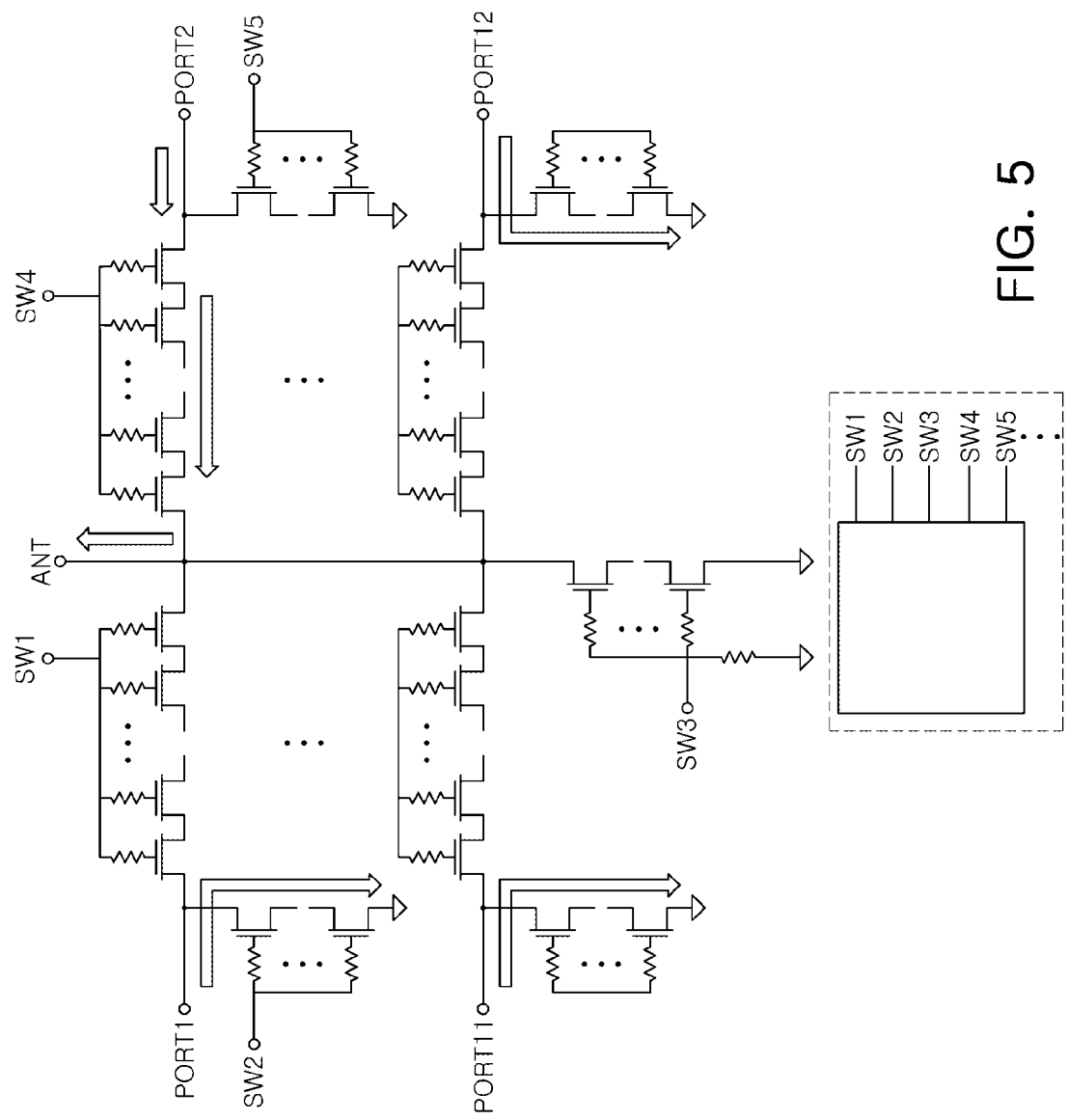

FIGS. 4 and 5 illustrate an operation of the radio frequency switch circuit 100 in the transmission and reception mode.

Referring to FIG. 4, the first switch circuit unit 110 and the fifth switch circuit unit 121 may be in an on-state, and the second switch circuit unit 120, the third switch circuit unit 130, and the fourth switch circuit unit 111 may be in an off-state. The radio frequency signal input through the first signal port PORT1 passes through the first switch circuit unit 110 and radiates or is transmitted to the antenna port ANT.

Referring to FIG. 5, the second switch circuit unit 120 and the fourth switch circuit unit 111 is in an on-state, and the first switch circuit unit 110, the third switch circuit unit 130, and the fifth switch unit 121 is in an off-state. The radio frequency signal input through the second signal port PORT2 passes through the fourth switch circuit unit 111 and radiates or is transmitted to the antenna port ANT.

Figure 6:
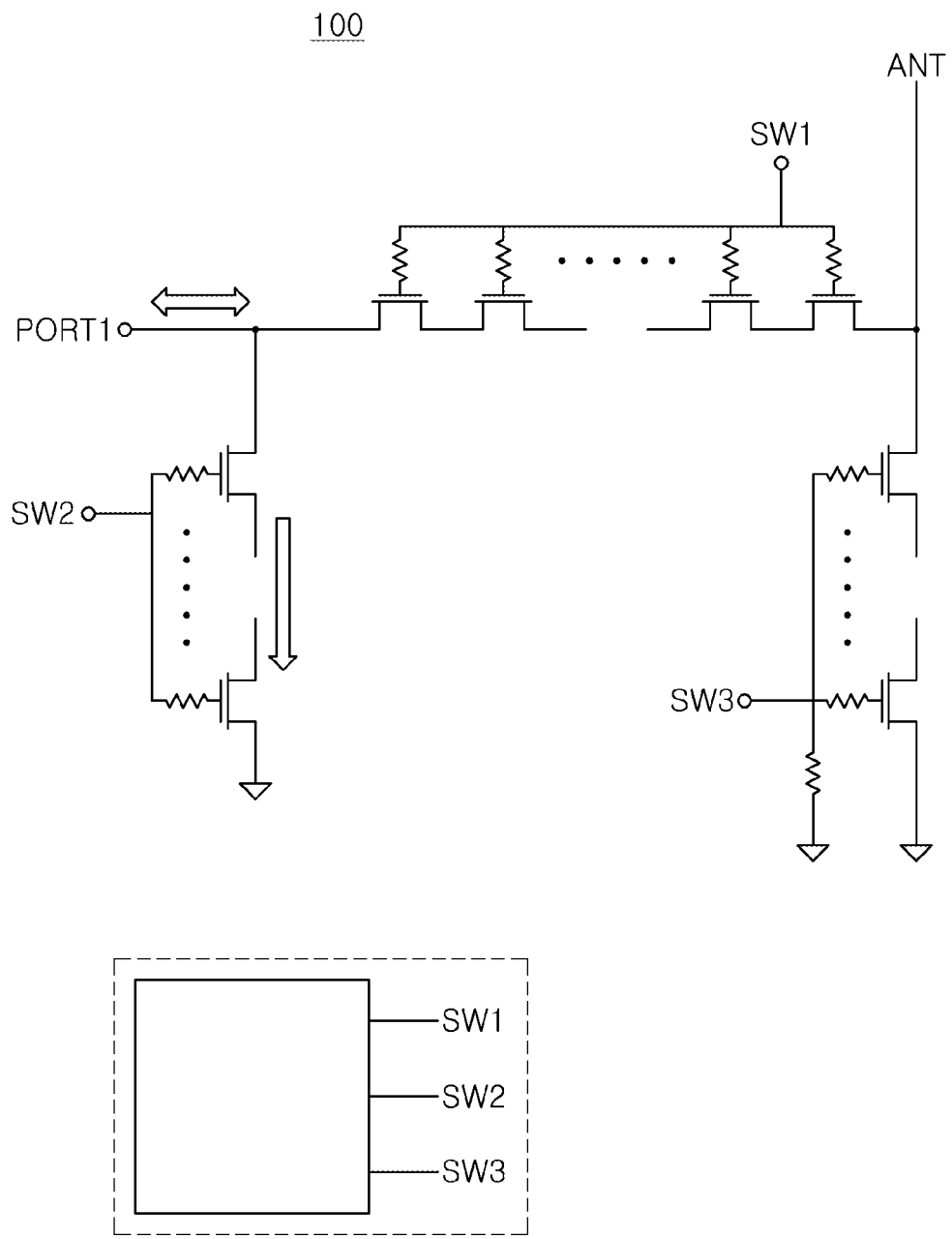
FIG. 6 illustrates an operation at one port of the radio frequency switch circuit in an isolation mode.

FIG. 6 illustrates an operation at one port of the radio frequency switch circuit 100 in the isolation mode.

Referring to FIG. 6, the second switch circuit unit 120 is in an on-state, and the first switch circuit unit 110 and the third switch circuit unit 130 is in an off-state. The leakage signals and noise input through the signal port PORT pass through the second switch circuit unit 120 and flow into the ground GND.

Figure 7:
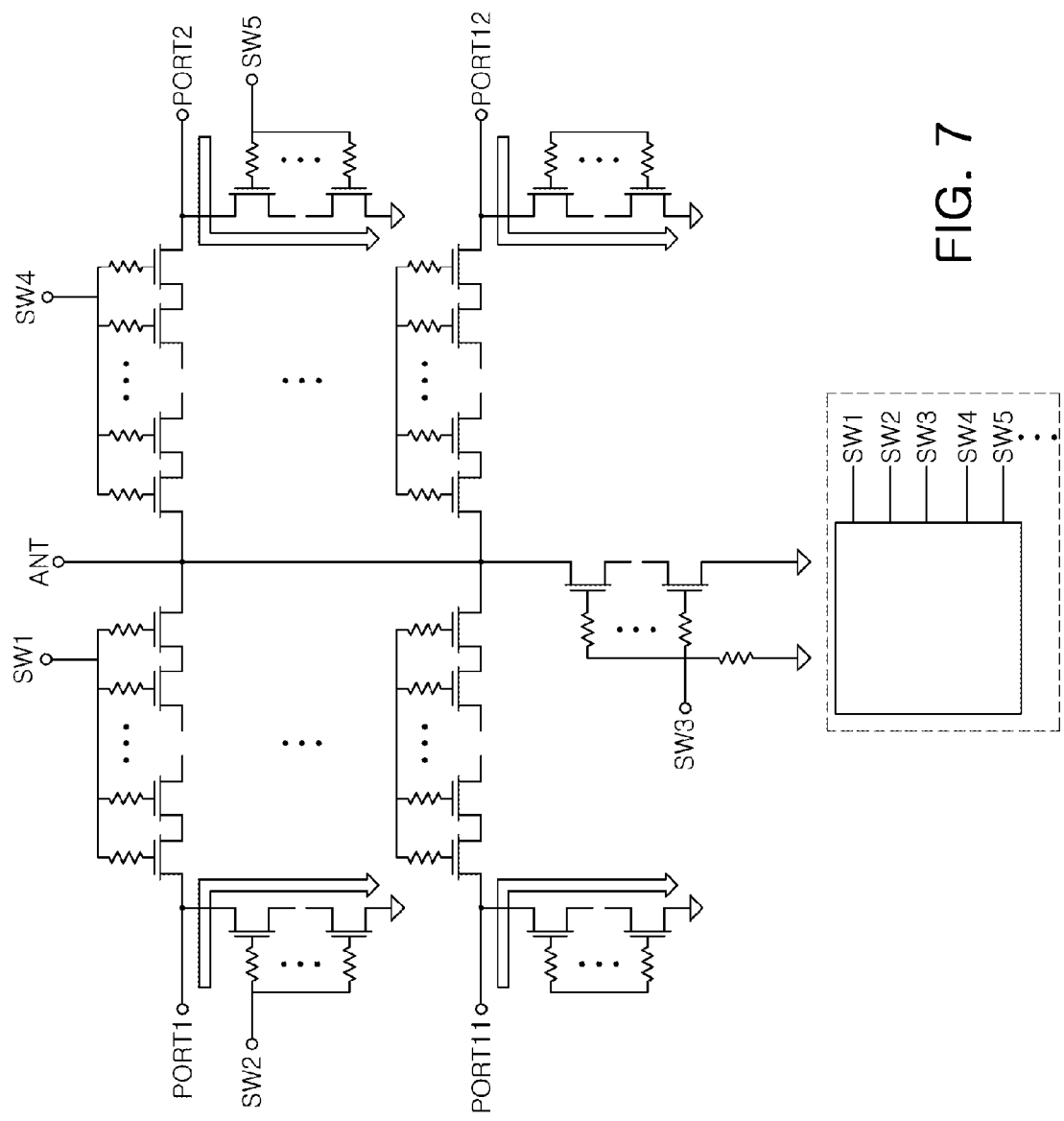
FIG. 7 illustrates an operation of the radio frequency switch circuit in the isolation mode.

FIG. 7 illustrates an operation of the radio frequency switch circuit 100 in the isolation mode.

Referring to FIG. 7, the second switch circuit unit 120 and the fifth switch circuit unit 121 are in an on-state, and the first switch circuit unit 110, the third switch circuit unit 130, and the fourth switch circuit unit 111 may be in an off-state. The leakage signals and noises input through the respective signal ports PORT pass through the second switch circuit unit 120 or the fifth switch circuit unit 121 and flow into the ground GND.

Figure 8:
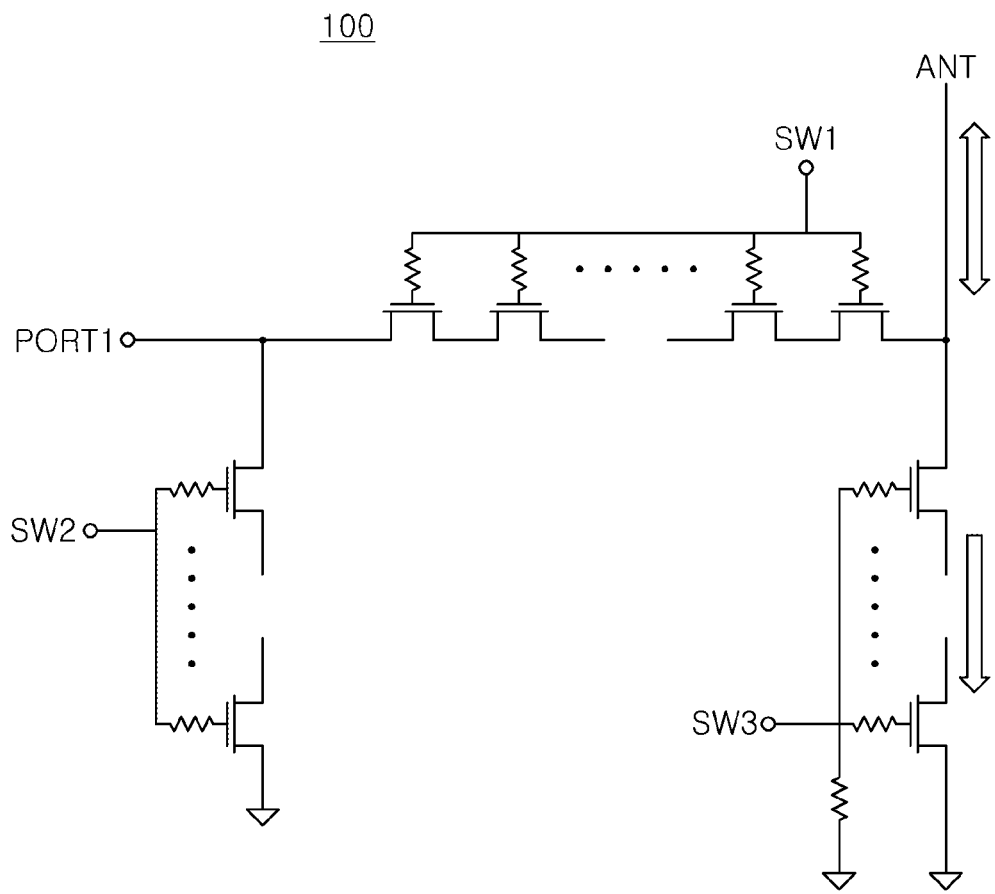
FIG. 8 illustrates an operation at one port of the radio frequency switch circuit in a low power mode.
Figure 8:
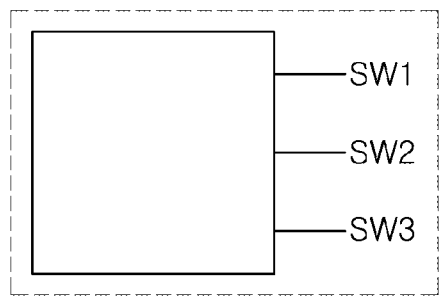

FIG. 8 illustrates an operation at one port of the radio frequency switch circuit 100 in the low power mode.

Referring to FIG. 8, the third switch circuit unit 130 is in an on-state, and the first switch circuit unit 110 and the second switch circuit unit 120 are in an off-state. An interference signal and noise input through the antenna port ANT pass through the third switch circuit unit 130 and flow into the ground GND.

Figure 9:
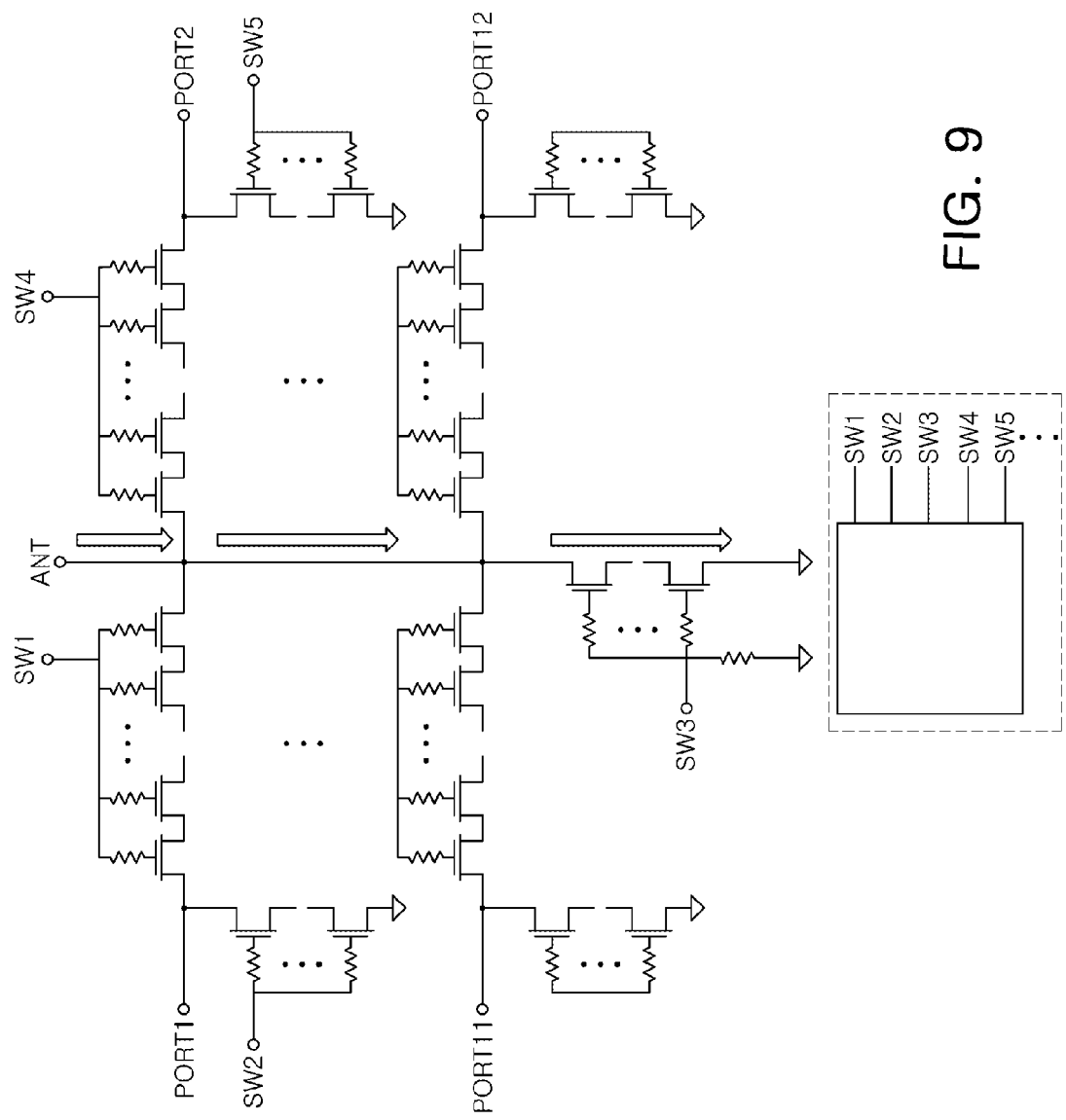
FIG. 9 illustrates an operation of the radio frequency switch circuit in the low power mode.

FIG. 9 illustrates an operation of the radio frequency switch circuit 100 in the low power mode.

Referring to FIG. 9, the third switch circuit unit 130 is in an on-state, and the first switch circuit unit 110, the second switch circuit unit 120, the fourth switch circuit unit 111, and the fifth switch circuit unit 121 are in an off-state. An interference signal and noise input through the antenna port ANT pass through the third switch circuit unit 130 and flow into the ground GND.

Figure 10:
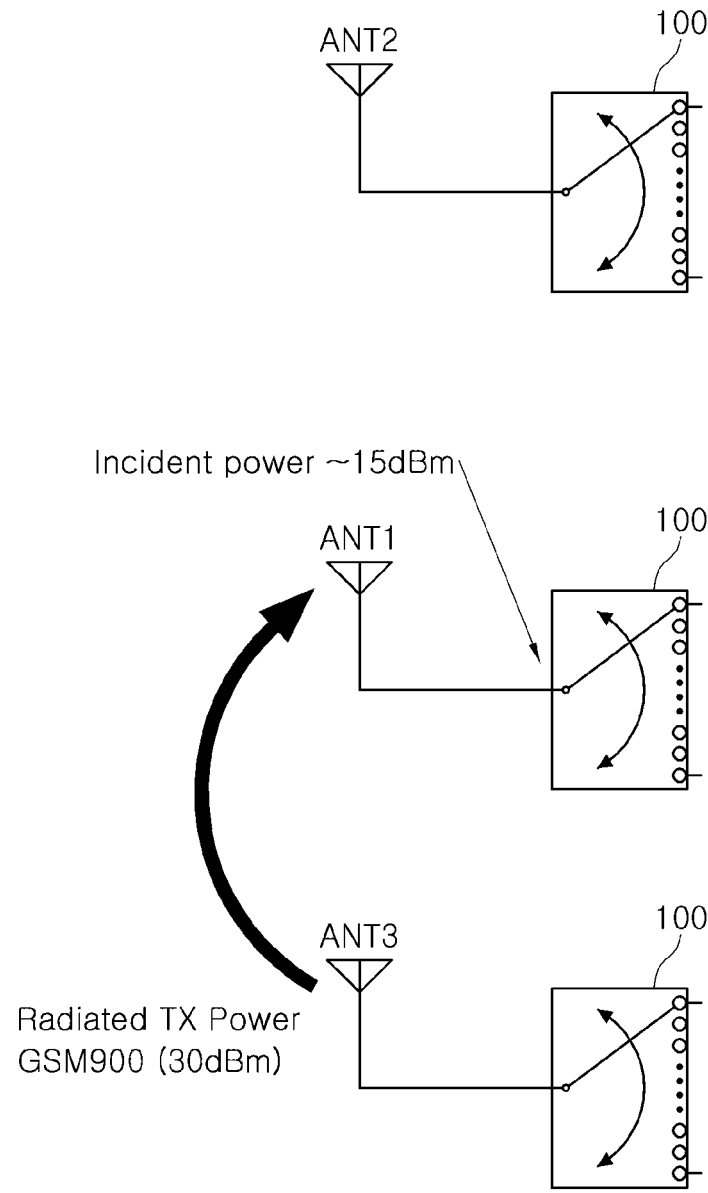
FIG. 10 is a view illustrating interference between a plurality of radio frequency switch circuits in an apparatus including the plurality of radio frequency switch circuits.

FIG. 10 is a view illustrating interference between radio frequency switch circuits in an apparatus including the radio frequency switch circuits.

Referring to FIG. 10, radio frequency switch circuits 100 and antennas ANT are included in a single device. For example, the radio frequency signal is transmitted and received through one of the radio frequency switch circuits 100 and remaining radio frequency switch circuits 100 are in a standby state. In a case in which a radio frequency signal of 30 dBm is output through a third antenna port ANT3, the first antenna port ANT1 or the second antenna port ANT2 receive a signal with high power.

For example, when isolation between antenna ports ANT is 15 to 20 dB, a signal of large power of 10 dBm to 15 dBm is introduced into the first antenna port ANT1 or the second antenna port ANT2.

If the radio frequency switch circuit 100 connected to the first antenna port ANT1 or the second antenna port ANT2 does not include the third switch circuit unit 130, the radio frequency switch circuit 100 generates a radio frequency of −30 dBm or more. A radiated spurious emission (RSE) specification limitation value of the radio frequency switch circuit 100 is −30 dBm. In a case in which the RSE specification limitation value described above exceeds −30 dBm, certification standards of European Communities (CE) and Federal Communications Commission (FCC) may not be satisfied.

In a case in which input power of 15 dBm is introduced into the radio frequency switch circuit 100, which does not include the third switch circuit unit 130, the switch circuit unit connected to the antenna port ANT may enter a slightly on-state and may abnormally operate. In a case in which the switch circuit unit connected to the antenna port ANT is operated in the slightly on-state, the switch circuit unit operates in a non-linear region, thereby causing radiated spurious emission.

Therefore, the radio frequency switch circuit 100 includes the third switch circuit unit 130 and, thus, the RSE specification limitation value is satisfied. For example, in a case in which a signal of 15 dBm is introduced into the radio frequency switch circuit 100 including the third switch circuit unit 130, magnitude of the generated radio frequency is −80 dBm.

Figure 11A:
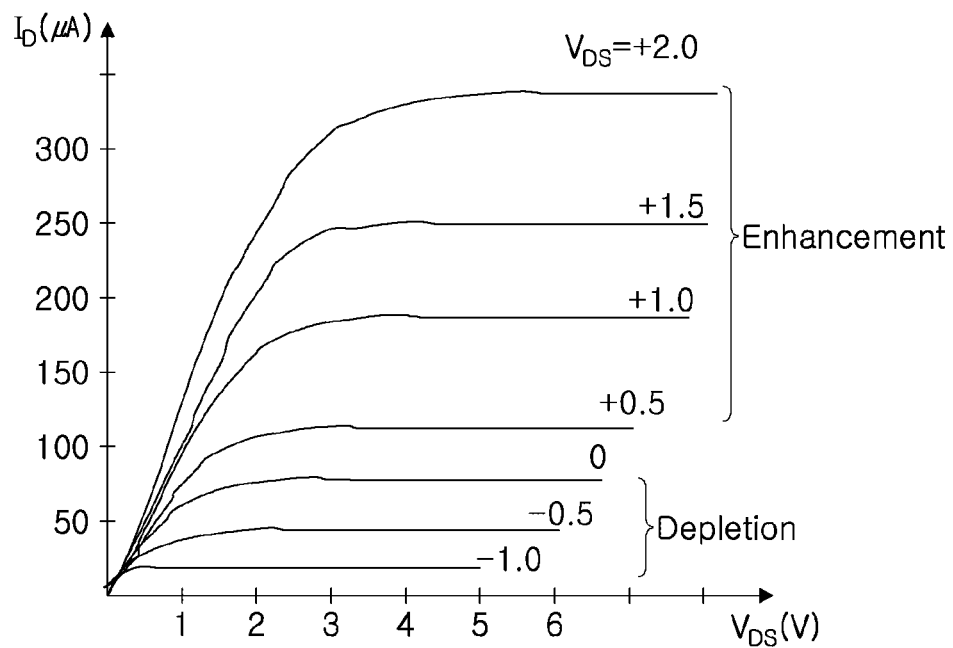
FIGS. 11A and 11B are graphs illustrating characteristics of a depletion-type field effect transistor included in FIGS. 1 and 2.
Figure 11B:
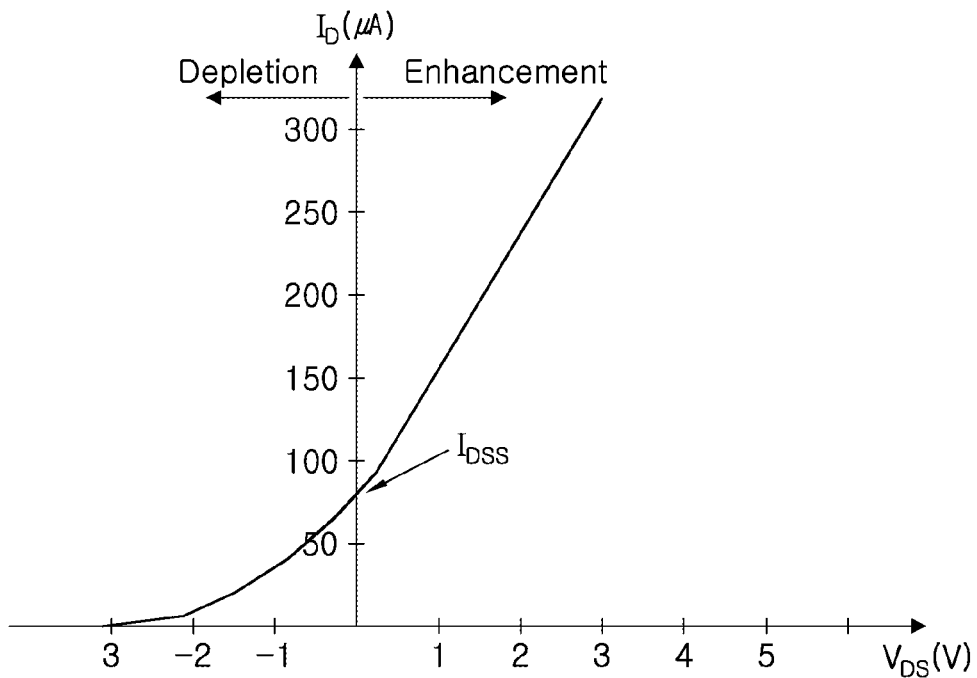

FIG. 11A and FIG. 11B are graphs illustrating characteristics of the depletion type field effect transistor included in FIGS. 1 and 2.

Referring to FIG. 11A, this figure illustrates a current value according to a voltage between a drain terminal and a source terminal of the field effect transistor (FET). FIG. 11B illustrates a current value according to a voltage between the gate terminal and the source terminal of the depletion-type field effect transistor (FET). In the depletion type field effect transistor, even in a state in which the voltage between the gate terminal and the source terminal is 0V, the current may flow.

Hereinafter, a control method of a radio frequency switch circuit, according to an embodiment, will be described. Because a control method of a radio frequency switch circuit, according to an embodiment, is performed in the radio frequency switch circuit 100 described above with reference to FIGS. 1 and 2, a description that is the same as or corresponds to the description described above will be omitted.

Figure 12:
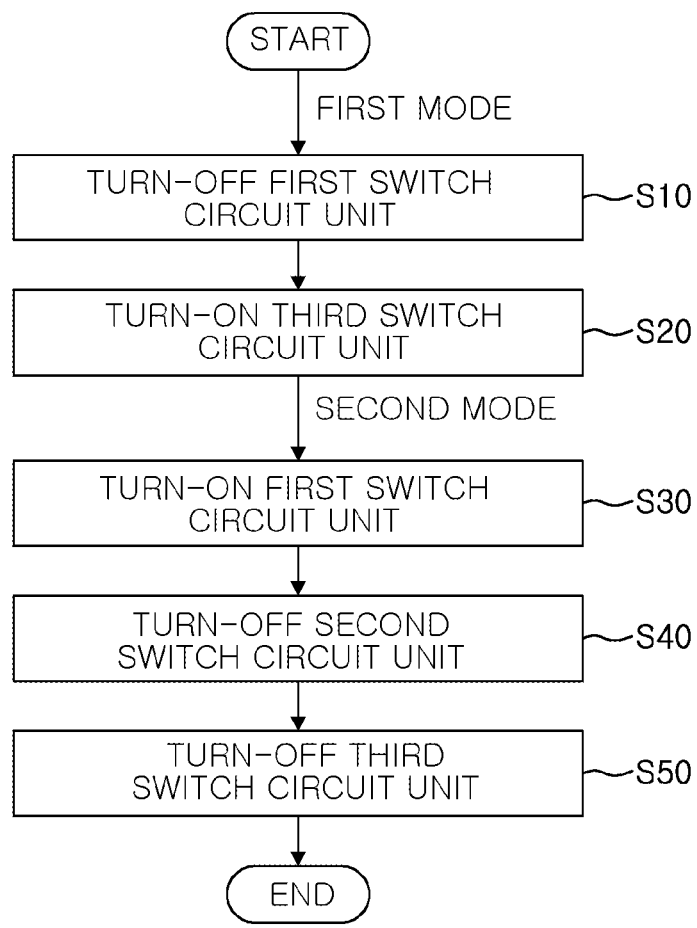
FIG. 12 is a flow chart illustrating a first mode operation and a second mode operation of a control method of a radio frequency switch circuit, according to an embodiment.

FIG. 12 is a flow chart illustrating a first mode operation and a second mode operation of the control method of a radio frequency switch circuit, according to an embodiment.

Referring to FIG. 12, the first mode operation of the control method of a radio frequency switch circuit, according to the embodiment, performs, at operation (S10), an interruption between a plurality of signal ports of a signal transmission and reception and a common connection node connected to an antenna port, and between the plurality of signal ports and a ground, and, at operation (S20), the first mode operation of the control method of a radio frequency switch circuit conducts between the common connection node and the ground. In one example, the first mode is the low power mode described above.

Referring to FIG. 12, the second mode operation of the control method of a radio frequency switch circuit, according to the embodiment, performs, at operation (S30), a signal conduction between one of the plurality of signal ports and the common connection node and an interruption of signal transmission and reception or conduction between other signal ports and the common connection node. At operation (S40) the second mode operation of the control method of a radio frequency switch circuit performs an interruption between one of the plurality of signal ports and the ground and conducts between other signal ports and the ground. At operation (S50), the second mode operation of the control method of a radio frequency switch circuit performs an interruption between the common connection node and the ground. In one example, the second mode is the transmission mode described above.

Figure 13:
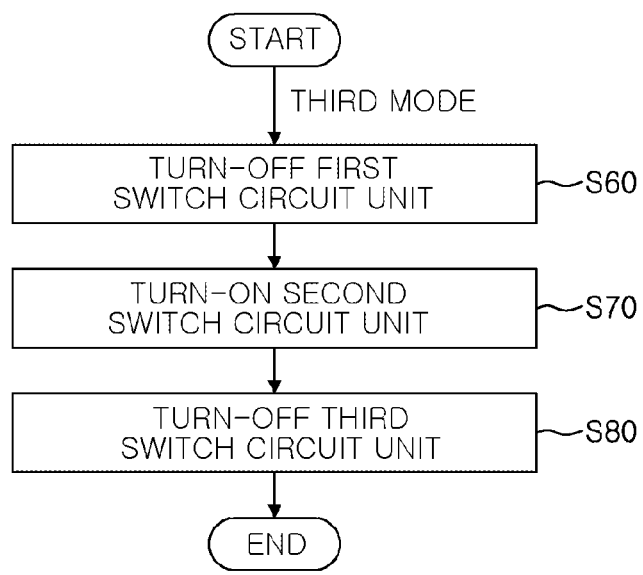
FIG. 13 is a flow chart illustrating a third mode operation of the control method of a radio frequency switch circuit, according to an embodiment.

FIG. 13 is a flow chart illustrating a third mode operation of the control method of a radio frequency switch circuit, according to an embodiment.

Referring to FIG. 13, the third mode operation of the control method of a radio frequency switch circuit, according to an embodiment performs, at operation (S60), an interruption of signal transmission and reception or conduction between the plurality of signal ports and the common connection node connected to the antenna port. At operation (S70), the third mode operation of the control method of a radio frequency switch circuit conducts between the plurality of signal ports and the ground, and, at operation (S80) performs an interruption of conduction between the common connection node and the ground. In one example, the third mode is the isolation mode described above.

The control method of a radio frequency switch circuit, according to an embodiment, suppresses interference occurring in the radio frequency switch circuit 100 by conducting between the common connection node connected to the antenna port and the ground. In addition, because interference that occurs when the radio frequency switch circuit 100 is operated in the low power mode is suppressed, the radio frequency switch circuit 100 is stably operated in a low power mode state. In addition, because interference occurring in the plurality of switch circuit units included in the radio frequency switch circuit 100 are suppressed by a single switch circuit unit, the interference is efficiently suppressed.

As set forth above, according to the embodiments, the radio frequency switch circuit decreases interference occurring due to an introduced interference signal.

Further, the radio frequency switch circuit is stably operated in the low power mode.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio frequency switch circuit, comprising:
   a first switch circuit unit connected between a signal port and an antenna port;
   a second switch circuit unit connected between the signal port and a ground; and
   a third switch circuit unit connected between the antenna port and the ground,
   wherein the first switch circuit unit, the second switch circuit unit, and the third switch circuit unit each comprise a transistor, and
   an operation reference voltage defining a gate-to-source voltage of the transistor in the third switch circuit unit is lower than an operation reference voltage defining a gate-to-source voltage of the transistor in the first switch circuit unit.

2. The radio frequency switch circuit of claim 1, further comprising:
   a control unit configured to generate a first gate signal, a second gate signal, and a third gate signal to control the first switch circuit unit, the second switch circuit unit, and the third switch circuit unit, respectively.

3. The radio frequency switch circuit of claim 2, wherein the control unit excludes generation of the first gate signal, the second gate signal, and the third gate signal in a low power mode.

4. The radio frequency switch circuit of claim 3, wherein the first switch circuit unit enters an off-state in response to the first gate signal not being generated,
   the second switch circuit unit enters the off-state in response to the second gate signal not being generated, and
   the third switch circuit unit enters an on-state in response to the third gate signal not being generated.

5. The radio frequency switch circuit of claim 1, wherein the first switch circuit unit enters an on-state in a transmission and reception mode and enters an off-state in an isolation mode, and
   the second switch circuit unit enters the off-state in the transmission and reception mode and enters the on-state in the isolation mode.

6. The radio frequency switch circuit of claim 1, wherein the transistor of the third switch circuit unit is a depletion-type field effect transistor, and
   the operation reference voltage of the transistor of the third switch circuit is a negative voltage.

7. The radio frequency switch circuit of claim 1, wherein the first switch circuit unit, the second switch circuit unit, and the third switch circuit unit each comprise transistors, and
   one terminal of each of the transistors receives a gate signal.

8. The radio frequency switch circuit of claim 7, wherein the transistors enter an on-state when a voltage of the gate signal is higher than the operation reference voltage associated with the first switch circuit unit, the second switch circuit unit, and the third switch circuit unit.

9. The radio frequency switch circuit of claim 6, wherein the depletion-type field effect transistor has a gate terminal connected to a pull down resistor connected to the ground.

10. The radio frequency switch circuit of claim 1, wherein the transistor of the first switch circuit unit is a field effect transistor of an enhancement type, and the transistor of the of the third switch circuit unit is a depletion type field effect transistor with a negative operation reference voltage.

11. A radio frequency switch circuit, comprising:
a first switch circuit unit connected between a first signal port and an antenna port;
a second switch circuit unit connected between the first signal port and a ground;
a third switch circuit unit connected between the antenna port and the ground;
a fourth switch circuit unit connected between a second signal port and the antenna port; and
a fifth switch circuit unit connected between the second signal port and the ground,
wherein the first switch circuit unit, the second switch circuit unit, the third switch circuit, the fourth switch circuit unit, and the fifth switch circuit unit each comprise a transistor, and
an operation reference voltage defining a gate-to-source voltage of the transistor in the third switch circuit unit is lower than an operation reference voltage defining a gate-to-source voltage of the transistor in the first switch circuit unit and an operation reference voltage defining a gate-to-source voltage of the transistor in the fourth switch circuit unit.

12. The radio frequency switch circuit of claim 11, further comprising:
a control unit configured to generate a first gate signal, a second gate signal, a third gate signal, a fourth gate signal, and a fifth gate signal to control the first switch circuit unit, the second switch circuit unit, the third switch circuit unit, the fourth switch circuit unit, and the fifth switch circuit unit, respectively.

13. The radio frequency switch circuit of claim 12, wherein the third switch circuit unit enters an on-state in a low power mode, and
the control unit excludes generation of the first, the second, the third, the fourth, and the fifth gate signals in the low power mode.

14. The radio frequency switch circuit of claim 11, wherein the second switch circuit unit enters the off-state in response to the first signal port being in the transmission and reception mode and enters the on-state in response to other signal ports being in the transmission and reception mode or the isolation mode.

15. The radio frequency switch circuit of claim 11, wherein the transistor in the third switch circuit unit is a depletion-type field effect transistor,
the operation reference voltage is a negative voltage, and
the depletion-type field effect transistor comprises a gate terminal connected to a pull down resistor connected to the ground.

16. The radio frequency switch circuit of claim 11, wherein the first switch circuit unit enters an on-state in response to the first signal port being in a transmission and reception mode and enters an off-state in response to other signal ports being in the transmission and reception mode or an isolation mode.

17. The radio frequency switch circuit of claim 11, wherein the control unit interrupts conduction between signal ports and an antenna port in response to the radio frequency switch circuit being operated in a first mode,
conducts between the antenna port and a ground in response to the radio frequency switch circuit being operated in the first mode,
conducts between one of the signal ports and the antenna port and interrupts conduction between other signal ports and the antenna port in response to the radio frequency switch circuit being operated in a second mode,
interrupts conduction between one of the signal ports and the ground and conducts between other signal ports and the ground in response to the radio frequency switch circuit being operated in the second mode, and
interrupts conduction between the antenna port and the ground in response to the radio frequency switch circuit being operated in the second mode.

18. The radio frequency switch circuit of claim 17, wherein the control unit interrupts conduction between the signal ports and the ground in response to the radio frequency switch circuit is operated in the first mode,
interrupts conduction between the signal ports and the antenna port in response to the radio frequency switch circuit being operated in a third mode,
conducts between the signal ports and the ground in response to the radio frequency switch circuit being operated in the third mode, and
interrupts the signal transmission and reception between the antenna port and the ground in response to the radio frequency switch circuit being operated in the third mode.

* * * * *